(12) United States Patent
Huang

(10) Patent No.: US 10,908,181 B2
(45) Date of Patent: Feb. 2, 2021

(54) TEST DEVICE

(71) Applicants: HKC Corporation Limited, Guangdong (CN); Chongqing HKC Optoelectronics Technology Co., Ltd., Chongqing (CN)

(72) Inventor: Xiaoyu Huang, Guangdong (CN)

(73) Assignees: HKC Corporation Limited, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 215 days.

(21) Appl. No.: 16/246,873

(22) Filed: Jan. 14, 2019

(65) Prior Publication Data
US 2020/0096540 A1 Mar. 26, 2020

Related U.S. Application Data

(63) Continuation of application No. PCT/CN2018/115303, filed on Nov. 14, 2018.

(30) Foreign Application Priority Data

Sep. 21, 2018 (CN) .................... 2018 2 1562752 U

(51) Int. Cl.
*G01R 1/067* (2006.01)
(52) U.S. Cl.
CPC ................ *G01R 1/06716* (2013.01)
(58) Field of Classification Search
CPC .......... G01R 31/02; G01R 1/36; G01R 1/067; G01R 1/06716; G01R 1/06722; G01R 1/073; G01R 1/07328; G01R 1/07314; G01R 1/06788; G01R 1/06794
See application file for complete search history.

(56) References Cited

U.S. PATENT DOCUMENTS

| 3,577,208 A | 5/1971 | Petrick | |
|---|---|---|---|
| 5,663,655 A * | 9/1997 | Johnston | G01R 1/06722 324/110 |
| 6,731,104 B1 | 5/2004 | Yang | |
| 2004/0137800 A1* | 7/2004 | Jing | H01R 13/2421 439/700 |
| 2020/0271691 A1* | 8/2020 | Shan | G01R 1/06766 |

FOREIGN PATENT DOCUMENTS

| CN | 201780334 U | 3/2011 |
|---|---|---|
| CN | 204964934 U | 1/2016 |
| CN | 107525953 A | 12/2017 |
| CN | 107765047 A | 3/2018 |
| GB | 2145582 A | 3/1985 |

* cited by examiner

*Primary Examiner* — Son T Le

(57) ABSTRACT

The present disclosure disclosed a test device, which is defined with a test point connected with a circuit board of a display screen, thereby imputing a test signal to the display screen. The test device includes: a housing and a probe, an accommodation cavity with an open bottom is formed in the housing, a first contact and a second contact are defined on the inner wall of the accommodation cavity, the probe is defined in the accommodation cavity and movable between a first position and a second position in a first direction, when the probe is at a first position, a test signal may be conducted to a test point; when the probe is at a second position, the charge of the probe accumulated may be released.

18 Claims, 4 Drawing Sheets

TEST DEVICE

CROSS REFERENCE TO RELATED APPLICATIONS

The present application is a Continuation Application of PCT Application No. PCT/CN2018/115303 filed on Nov. 14, 2018, which claims the benefit of Chinese Patent Application No. 201821562752.7 filed on Sep. 21, 2018. All the above are hereby incorporated by reference.

FIELD

The present disclosure relates to the field of display technology, and in particular, relates to a test device.

BACKGROUND

Thin Film Transistor Liquid Crystal Display (TFT-LCD) is one of the main types of flat panel displayers and has become an important display platform in modern IT and video products. The driving principle of TFT-LCD is that the system motherboard connects R/G/B compression signal, control signal and power signal to the connector on the Printed Circuit Board, Printed Circuit Board (PCB for short) through wires, and the signal is processed by Timing Controller Integrated Circuit (TCON-IC) on the circuit board and then connected with the display area through Source-Chip on Film (S-COF), i.e., Source of Flexible Circuit Board and Gate—Chip on Film (G-COF), i.e., Gate of Flexible Circuit Board on the circuit board, thus enabling LCD to obtain required signals.

In order to avoid the damage to the connector caused by manual plugging and unplugging, the factory production line is equipped with an automatic test device configured to connect the circuit board, so that the signal originally input to the circuit board through the connector may be directly input to the test point on the circuit board through the metal probe of the automatic test device. Damage to the circuit board caused by manually plugging and unplugging the signal wires may be avoided by contacting the metal probe with the test point on the PCB to supply power and signals to the system motherboard. However, this method may cause the problem that after long-term use of the metal probe, a large amount of charge accumulates on the metal probe, thus causing electrostatic discharge (ESD) and damaging components.

SUMMARY

The main purpose of the present disclosure is to propose a test device, aimed at releasing the accumulated charge of the metal probe and avoiding damage to the components of the circuit board.

In order to achieve the above object, the test device provided by the present disclosure is defined with a test point connected with a circuit board of a display screen, thereby imputing a test signal to the display screen. the test device includes: a housing, an accommodation cavity with an open bottom is formed in the housing, a first contact and a second contact are defined on the inner wall of the accommodation cavity, the first contact communicates with the test signal, and the second contact is grounded; the probe, defined in the accommodation cavity and movable between a first position and a second position in a first direction, and the probe includes a conductor, when the probe is at the first position, the conductor connects the first contact and the test point to guide the test signal to the test point; when the probe is at the second position, the conductor connects the second contact to release the charge of the probe accumulated.

Optionally, the test device further includes an elastic member, the elastic member is defined in the accommodation cavity, abutting against and being between the probe and the wall of the cavity away from the opening of the housing.

Optionally, the probe further includes an insulator, the insulator contacts the second contact when the probe is at the first position, and the insulator contacts the first contact when the probe is at the second position.

Optionally, the conductor is defined in a columnar shape, and the outer wall surface of the conductor close to the second contact is defined with an embedded groove; the insulator includes a first insulator part filled in the embedding groove.

Optionally, the insulator further includes a second insulator disposed near the first contact, and the second insulator is fixedly defined at one end of the conductor away from the opening of the housing.

Optionally, the conductor includes a first conductor part defined corresponding to the embedding groove, a second conductor part connected with one end of the first conductor part, and a third conductor part connected with the other end of the first conductor part; the length of the second conductor part is the sum of the distance between the first contact and the second contact, and the height of the first contact or the height of the second contact along the first direction.

Optionally, the first conductor part, the second conductor part and the third conductor part are integrally formed, and the first conductor part, the second conductor part and the third conductor part are coaxially defined.

Optionally, a test surface in contact with the test point is formed on the surface of the third conductor part away from the first conductor part forms, and the test surface is defined in a plane.

Optionally, the first contact and the second contact are defined at interval; and both the first contact and the second contact protrude from the inner wall of the accommodation cavity.

Optionally, the first contact is defined with a plurality of evenly spaced contacts on the inner side wall of the accommodation cavity, the second contact is defined with a plurality of evenly spaced contacts on the inner side wall of the accommodation cavity.

The test device proposed by the present disclosure is defined with a test point connected with a circuit board of a display screen, thereby imputing a test signal to the display screen. the test device includes: a housing and a probe, an accommodation cavity with an open bottom is formed in the housing, a first contact and a second contact are defined on the inner wall of the accommodation cavity, the first contact communicates with the test signal, and the second contact is grounded; the probe is defined in the accommodation cavity and movable between a first position and a second position in a first direction, and the probe includes a conductor, when the probe is at the first position, the conductor connects the first contact and the test point to guide the test signal to the test point; when the probe is at the second position, the conductor connects the second contact to release the charge of the probe accumulated.

When the probe is at the first position, the conductor of the probe abuts against the test point on the circuit board, and the conductor is connected with the first contact, thereby the conductor may connect the first contact and the test point, and the test signal may flow to the test point on the circuit board after being input from the first contact, and the test signal includes the power signal, control signal, R/G/B compression signal and the like required by the display screen. Thus the performance of the display screen may be conveniently tested and damage to the circuit board caused by manually plugging and unplugging the signal line may be avoided; when the probe is located at the second position, the conductor of the probe departs from the test point on the circuit board, the conductor connects the second contact, and the second contact is grounded. Thus, the charge of the probe accumulated may be conducted to the ground through the second contact, and the charge of the probe accumulated may be released thereby, which effectively reduces the possibility of electrostatic discharge and improves the production yield.

BRIEF DESCRIPTION OF THE DRAWINGS

In order to explain the embodiments of the present disclosure or the technical schemes in the exemplary technology more clearly, the drawings that need to be used in the embodiments or the exemplary technical descriptions will be briefly described below. Obviously, the drawings in the following description are only some embodiments of the present disclosure. For those of ordinary skill in the art, other drawings can be obtained according to the structures shown in these drawings without paying creative labor.

BRIEF DESCRIPTION OF THE DRAWINGS

Figure 1:
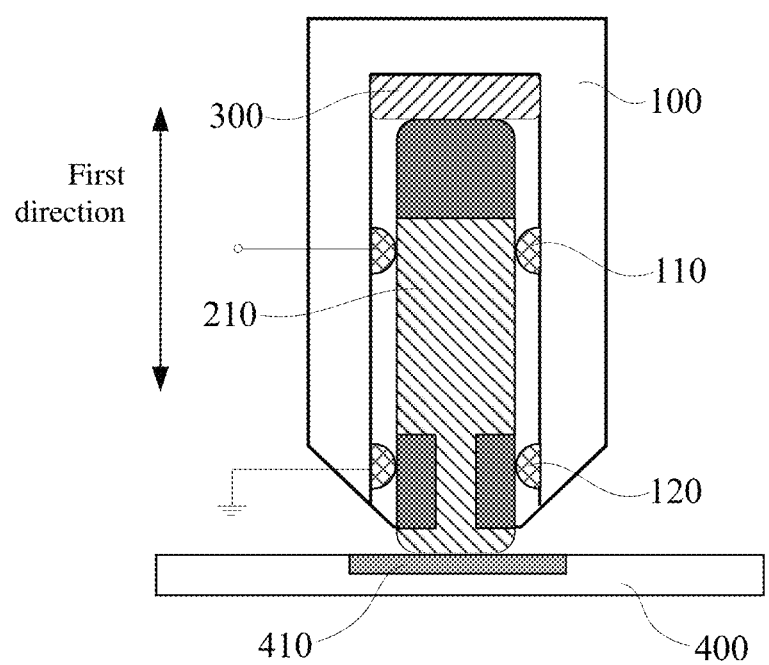
FIG. 1 is a schematic structural diagram of a test device of the present disclosure, which is at a first position.

| Label | Name |
|---|---|
| 100 | Housing |
| 200 | Probe |
| 300 | Elastic member |
| 400 | Circuit board |
| 110 | First contact |
| 120 | Second contact |
| 210 | Conductor |
| 220 | Insulator |
| 410 | Test point |
| 211 | First conductor part |
| 212 | Second conductor part |
| 213 | Third conductor part |
| 221 | First insulator |
| 222 | Second insulator |

The realization, functional features and advantages of the purpose of the present disclosure will be further described with reference to the accompanying drawings in combination with the embodiments.

DETAILED DESCRIPTION OF THE EMBODIMENTS

The technical schemes in the embodiments of the present disclosure will be described clearly and completely in the following with reference to the drawings in the embodiments of the present disclosure. Obviously, the described embodiments are only a part of the embodiments of the present disclosure, but not all the embodiments. Based on the embodiments in the present disclosure, all other embodiments obtained by a person of ordinary skill in the art without creative labor are within the scope of protection of the present disclosure.

It should be noted that if directional indications (such as up, down, left, right, front, back, etc.) are involved in the embodiments of the present disclosure, the directional indications are only used to explain the relative positional relationship and movement between the components in a certain posture (as shown in the drawings), and if the specific posture changes, the directional indications will change accordingly.

In addition, if there are descriptions related to "first" and "second" in the embodiments of the present disclosure, the descriptions of "first" and "second" are used for descriptive purposes only and cannot be understood as indicating or implying their relative importance or implicitly indicating the number of indicated technical features. Thus, features defined with "first" and "second" may explicitly or implicitly include at least one such feature. In addition, the technical proposal of each exemplary embodiment may be combined with each other, however the technical proposal must base on that the ordinary skill in that art may realize the technical proposal, when the combination of the technical proposals occurs contradiction or may not realize, it should consider that the combination of the technical proposals does not existed, and is not contained in the protection scope required by the present disclosure.

The present disclosure provides a test device, which may effectively release the charge of the probe accumulated due to its long-time contact with the test point on the circuit board during operation, thereby effectively reducing the possibility of electrostatic discharge.

Figure 2:
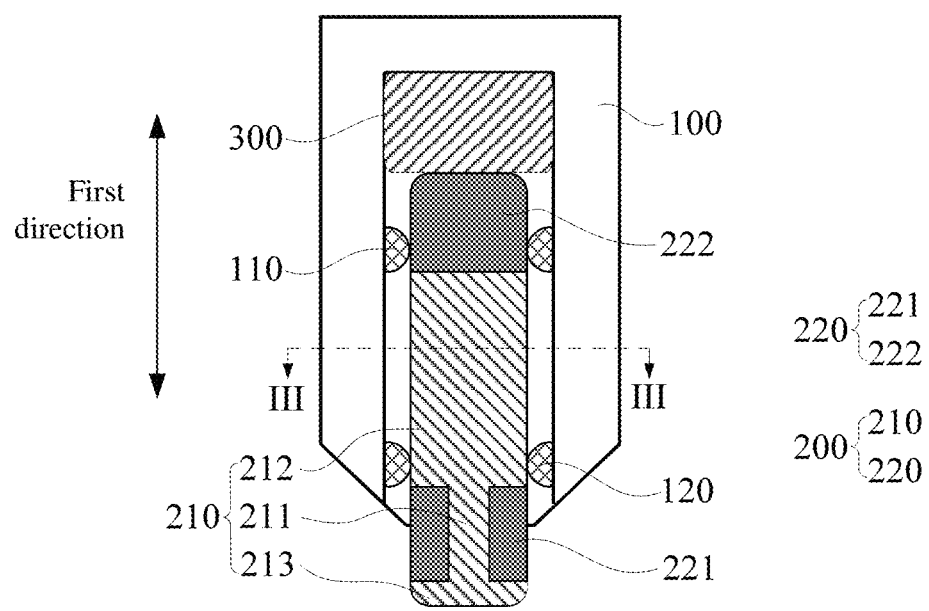
FIG. 2 is a schematic structural diagram of the test device of the present disclosure, which is at a second position.

In some embodiments of the present disclosure, as shown in FIGS. 1 and 2, in FIG. 1, the probe is at the first position, in FIG. 2, the probe is at the second position. The test device is defined with a test point 410 connected with a circuit board 400 of a display screen, thereby imputing a test signal to the display screen. the test device includes: a housing 100 and a probe 200, an accommodation cavity with an open bottom is formed in the housing 100, a first contact 110 and a second contact 120 are defined on the inner wall of the accommodation cavity, the first contact 110 communicates the test signal, the second contact 120 is grounded, the probe 200 is defined in the accommodation cavity and movable between a first position and a second position in a first direction, and the probe 200 includes a conductor 210, when the probe 200 is at the first position, the conductor 210 connects the first contact 110 and the test point 410 to guide the test signal to the test point 410; when the probe 200 is at the second position, the conductor 210 connects the second contact 120 to release the charge of the probe 200 accumulated.

Specifically, the probe 200 may move in the first direction in the accommodation cavity. As shown in FIG. 1, when the probe 200 is at the first position, the conductor 210 of the probe 200 abuts against the test point 410 on the circuit board 400, and the conductor 210 is connected with the first contact 110, so that the conductor 210 may connect the first contact 110 and the test point 410. thereby the test signal may flow to the test point 410 on the circuit board 400 after being input from the first contact 110, and the test signal includes the power signal, control signal, R/G/B compression signal and the like required by the display screen. Thus the performance of the display screen may be conveniently tested and damage to the circuit board 400 caused by manually plugging and unplugging the signal line may be avoided; As shown in FIG. 2, when the probe 200 is located at the second position, the conductor 210 of the probe 200 departs from the test point 410 on the circuit board 400, the conductor 210 connects the second contact 120, and the second contact 120 is grounded. Thus, the charge of the probe 200 accumulated may be conducted to the ground through the second contact 120, and the charge of the probe 200 accumulated may be released thereby, which effectively reduces the possibility of electrostatic discharge and improves the production yield.

The housing 100 may be made of an insulating material such as plastic, and the housing 100 is configured to provide a movement space for the probe 200 so as to prevent the probe 200 from shaking during movement in the first direction. In this embodiment, the probe 200 is provided in a cylindrical structure, the conductor 210 of the probe 200 is made of a material with conductive properties such as a metal material, and the probe 200 is inserted into the accommodation cavity, the first contact 110 and the second contact 120 are defined on the inner peripheral wall of the accommodation cavity, the outer peripheral wall of the probe 200 is in contact with the first contact 110 and the second contact 120, and the first contact 110 and the second contact 120 are made of a material with conductive properties such as metal.

It should be noted here that the Electro-Static Discharge refers to charge transfer caused by objects having different electrostatic potentials getting close to each other or directly contacting each other. That is to say, a metal probe 200 that has accumulated a large amount of charge inevitably generates static electricity when it comes into contact with a test point 410 on the PCB board, causing electrostatic discharge and transient voltage of thousands volts, which leads to electrostatic damage to the board and making LCD panel out of operation. In addition, the display screens described in the embodiments of the present disclosure include, but are not limited to, such as Thin Film Transistor Liquid Crystal Display (TFT-LCD), Organic Light Emitting Diode (OLED), Quantum Dot Display (QLED) plasma display panel, etc.

Further, please continue to refer to FIGS. 1 and 2. In order to facilitate the switching of the probe 200 between the first position and the second position, in some embodiments of the present disclosure, the test device further includes an elastic member 300. The elastic member 300 is disposed in the accommodation cavity, abutting and being between the probe 200 and an open cavity wall of the accommodation cavity away from the housing 100. In this way, when the probe 200 is at the first position, the conductor 210 contacts the test point 410 on the circuit board 400, and the probe 200 is forced to compress the elastic member 300, causing the elastic member 300 to compress and deform. At the same time, the elastic member 300 exerts pressure on the elastic needle, enabling the probe 200 to be in close contact with the test point 410 on the circuit board 400. When the probe 200 is at the first position, the conductor 210 is in contact with the first contact 110 and the test point 410 on the circuit board 400, and the probe 200 is forced to compress the elastic member 300, causing the elastic member 300 to compress and deform. At the same time, the elastic member 300 exerts pressure on the probe 200, enabling the probe 200 to be in close contact with the test point 410 on the circuit board 400. When the probe 200 is at the second position, the conductor 210 is separated from the test point 410 on the circuit board 400, and the elastic member 300 restores its deformation. At this time, the elastic member 300 pushes the probe 200 to move in the first direction, thereby enabling the conductor 210 to be separated from the first contact 110 and connected with the second contact 120. Thus, the charge accumulated on the probe 200 may be released and electrostatic discharge may be avoided.

Further, please refer to FIG. 2, considering that the conductor 210 may not contact the first contact 110 and the second contact 120 at the same time, which make the probe 200 prone to shake. In order to avoid shaking during the movement of the probe 200 in the first direction, in some embodiments of the present disclosure, the probe 200 also includes an insulator 220, which contacts the second contact 120 when the probe 200 is at the first position, and contacts the first contact 110 when the probe 200 is at the second position. In this way, the probe 200 may always keep in contact with the first contact 110 and the second contact 120, and the first contact 110 and the second contact 120 may provide a location limiting function for the probe 200, thus ensuring the probe 200 to move smoothly in the first direction and further ensuring the conductor 210 to achieve good electrical contact with the first contact 110 or the second contact 120.

However, the design of the present disclosure is not limited to this. In other embodiments, the probe may also include only the conductor. Under such situation, the accommodation cavity needs to have sufficient accommodating space, and the conductor may be brought into contact with the first contact or with the second contact by moving the conductor over a long distance.

Further, referring to FIG. 2, the structure of the insulator 220 of the probe 200 will now be described in detail. The probe 200 is defined in a columnar shape, and includes a conductor 210 and an insulator 220. In this embodiment, the conductor 210 is defined with an embedding groove on the outer wall surface near the second contact 120. The insulator 220 includes a first insulator part 221 filled in the embedding groove. Thereby, when the probe 200 is at the first position, the second contact 120 abuts against the first insulator 221, thus not only ensuring the stability of the movement of the probe 200 in the accommodation cavity, but also preventing the first contact 110 and the second contact 120 from being electrically connected at the same time.

It should be noted here that since the first insulator 221 is filled in the embedding groove, a stable connection between the first insulator 221 and the conductor 210 may be ensured.

Further, the insulator 220 also includes a second insulator 222 disposed near the first contact 110, and the second insulator 222 is fixedly disposed at the end of the conductor 210 away from the opening of the housing 100. Thereby, when the probe 200 is at the second position, the first contact 110 abuts against the second insulator 222, thus not only ensuring the stability of the movement of the probe 200 in the accommodation cavity, but also preventing the first contact 110 and the second contact 120 from being electrically connected at the same time.

The first insulator 221 and the second insulator 222 may be made of plastic or rubber materials, and the molding process may be injection molding the first insulator 221 and the second insulator 222 on the conductor 210. The injection molding process has the advantages of simple process and low cost.

Further, still referring to FIG. 2, the structure of the conductor 210 of the probe 200 will now be described in detail. The conductor 210 includes a first conductor part 211 defined corresponding to the embedding groove, a second conductor part 212 connected with one end of the first conductor part 211, and a third conductor part 213 connected with the other end of the first conductor part 211. The length of the second conductor part 212 is the sum of the distance between the first contact 110 and the second contact 120, and the height of the first contact 110 or the height of the second contact 120 in the first direction, so that the probe 200 moves a small distance during its movement in the first direction (generally, the specifications of the first contact 110 and the second contact 120 are the same; The distance the probe 200 moves is approximately the height of the first contact 110 or the second contact 120 in the first direction). Thereby, when the second conductor part 212 conducts with the first contact 110, the second conductor part 212 separates from the second contact 120; When the second conductor part 212 conducts with the second contact 120, the second conductor part 212 disengages from the first contact 110, i.e., the second conductor part 212 conducts only with the first contact 110 or the second contact 120 at the same time. And, the length of the second conductor part 212 in the first direction is the shortest, so that the total length of the conductor may be minimized, and the structure of the test device may be made the most compact.

Further, as shown in FIG. 2, in order to facilitate the processing and formation of the electrical conductor, in some embodiments of the present disclosure, the first electrical conductor 211, the second electrical conductor 212 and the third electrical conductor 213 are integrally formed, and the first electrical conductor 211, the second electrical conductor 212 and the third electrical conductor 213 are coaxially defined. Specifically, the process of the conductor is cutting on the rod-shaped conductive material to form the embedded groove, so that the first conductor 211 locates in the corresponding position of the embedded groove. The second conductor part 212 is a longer part connected with one end of the first conductor part 211. The third conductor part 213 is a shorter part connected with the other end of the first conductor part 211. Therefore, the formation of the conductor 210 is simple, and the process of the conductor is convenient.

Further, please continue to refer to FIG. 2, in order to reduce the probability of electrostatic discharge, in some embodiments of the present disclosure, the test surface of the third conductor part 213 is defined in a plane. Specifically, a test surface in contact with the test point 410 is formed on the surface of the third conductor part 213 away from the first conductor part 211, and the test surface is defined in a plane. Since the third conductor part 213 is defined in a smooth plane, bumps on the surface of the test surface may be avoided, so that tip discharge may be avoided, the probability of occurrence of electrostatic discharge may be reduced, and the yield of wire may be improved.

In some embodiments, the third conductor part 213 has a certain thickness, and the test surface is the end surface of the third conductor part 213 away from the first conductor part 211, and the end surface is smoothly connected with the side surface of the third conductor part 213, so that the probability of electrostatic discharge may be further reduced.

Further, referring to FIGS. 1 and 2, the structure of the first contact 110 and the second contact 120 will now be described in detail. In this embodiment, the first contact 110 and the second contact 120 are spaced apart in the first direction, and the first contact 110 is located above the second contact 120; and the first contact 110 and the second contact 120 both protrude from the inner wall of the accommodation cavity, so that the first contact 110 and the second contact 120 may abut against the outer peripheral wall of the probe 200; The first contact 110 is defined to access a test signal. Therefore, when the probe 200 is at the first position, the second conductor part 212 is connected with the first contact 110, the third conductor part 213 is connected with the test point 410 on the PCB board, and the second conductor part 212 is connected with the third conductor part 213 through the first conductor part 211. Thus, the test signal is accessed to the PCB board of the display screen, so that the performance of the display screen may be tested. The second contact 120 is grounded. When the probe 200 is at the second position, the third conductor part 213 is separated from the test point 410, and the second conductor part 212 is connected with the second contact 120. Thus, the charge accumulated on the conductor 210 may be conducted to the ground through the second contact 120.

Further, in order to electrically connect the probe 200 with the first contact 110 and the second contact 120 well, the first contact 110 is defined with a plurality of evenly spaced contacts on the inner side wall of the accommodation cavity, and the second contact 120 is defined with a plurality of evenly spaced contacts on the inner side wall of the accommodation cavity.

Figure 3:
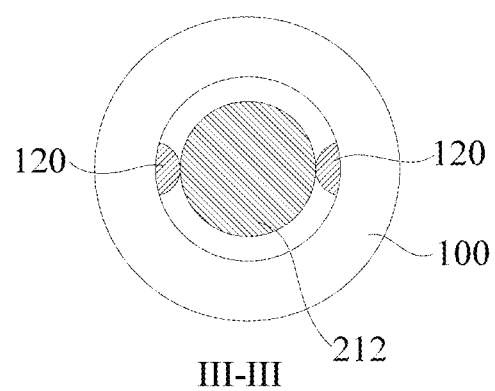
FIG. 3 is a sectional view taken along the direction III-III in FIG. 2.
Figure 4:
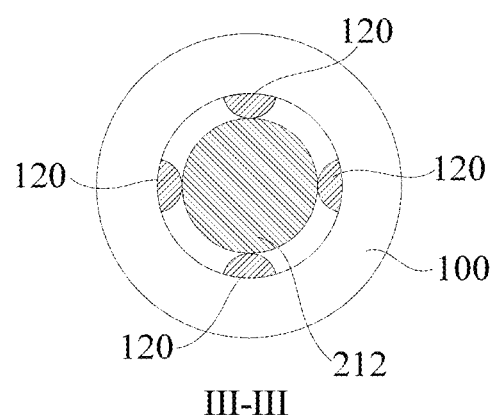
FIG. 4 is a cross-sectional view of a test device in another embodiment of the present disclosure taken along the direction III-III in FIG. 2.

Specifically, in some embodiments of the present disclosure, please refer to FIG. 3, the first contact 110 and the second contact 120 are respectively defined with two, the two first contacts 110 are defined facing to each other on the inner side wall of the accommodation cavity, and the two second contacts 120 are defined opposite to each other on the inner side wall of the accommodation cavity. In the second embodiment of the present disclosure, please refer to FIG. 4, the first contact 110 and the second contact 110 are respectively defined with four, the four first contacts 110 are defined as being evenly spaced on the inner side wall of the accommodation cavity, the four second contacts 120 are defined as being evenly spaced on the inner side wall of the accommodation cavity. Thus, the first contact 110 and the second contact 120 may maintain good electrical connection with the probe.

In some embodiments, the first contact 110 and the second contact 120 are both defined in a semi-circular arc shape.

The above is only an alternative embodiment of the present disclosure, and is not intended to limit the scope of the patent of the present disclosure. Any equivalent structural change made by using the contents of the present disclosure specification and drawings, or directly/indirectly applied in other related technical fields, is included in the scope of the patent protection of the present disclosure under the inventive concept of the present disclosure.

What is claimed is:

1. A test device, configured to connect a test point of a circuit board of a display screen to input a test signal to the display screen, wherein the test device comprises:
   a housing, wherein an accommodation cavity with an open bottom is formed in the housing, a first contact and a second contact are defined on the inner wall of the accommodation cavity, the first contact communicates with the test signal, and the second contact is grounded; and
   a probe, defined in the accommodation cavity and movable between a first position and a second position in a first direction, wherein the probe comprises a conductor, when the probe is at the first position, the conductor connects the first contact and the test point to guide the test signal to the test point; when the probe is at the second position, the conductor connects the second contact to release the charge of the probe accumulated.

2. The test device according to claim 1, wherein the test device further comprises an elastic member, the elastic member is defined in the accommodation cavity, abutting against and being between the probe and the wall of the cavity away from the opening of the housing.

3. The test device according to claim 2, wherein the probe further comprises an insulator, the insulator contacts the second contact when the probe is at the first position, and the insulator contacts the first contact when the probe is at the second position.

4. The test device according to claim 3, wherein the conductor is defined in a columnar shape, and the outer wall surface of the conductor near the second contact is defined with an embedding groove; the insulator comprises a first insulator part filled in the embedding groove.

5. The test device of claim 4, wherein the first insulator part is injection molded in the embedding groove.

6. The test device according to claim 4, wherein the insulator further comprises a second insulator part near the first contact, and the second insulator part is defined at an end of the conductor away from the opening of the housing.

7. The test device according to claim 4, wherein the conductor comprises a first conductor part defined corresponding to the embedding groove, a second conductor part connected with one end of the first conductor part, and a third conductor part connected with the other end of the first conductor part;
the length of the second conductor part is the sum of the distance between the first contact and the second contact, and the height of the first contact or the height of the second contact along the first direction.

8. The test device according to claim 7, wherein the first conductor part, the second conductor part and the third conductor part are integrally formed.

9. The test device according to claim 7, wherein a test surface in contact with the test point is formed on the surface of the third conductor part away from the first conductor part forms, and the test surface is defined in a plane.

10. The test device according to claim 9, wherein the test surface is smoothly connected with the peripheral side surface of the third conductor part.

11. The test device according to claim 1, wherein the first contact and the second contact are defined at interval; and both the first contact and the second contact protrude from the inner wall of the accommodation cavity.

12. The test device according to claim 11, wherein the first contact is defined with a plurality of evenly spaced contacts on the inner side wall of the accommodation cavity, The second contact is defined with a plurality of evenly spaced contacts on the inner side wall of the accommodation cavity.

13. The test device according to claim 12, wherein the first contact and the second contact are respectively defined with two, the two first contacts are defined facing to each other on the inner side wall of the accommodation cavity, the two second contacts are defined facing to each other on the inner side wall of the accommodation cavity.

14. The test device according to claim 12, wherein the first contact and the second contact are respectively defined with four, the four first contacts are defined being evenly spaced in the circumferential direction of the accommodation cavity, the four second contacts are defined as being evenly spaced on the inner side wall of the accommodation cavity.

15. The test device of claim 8, wherein the first contact and the second contact are defined at interval; and both the first contact and the second contact protrude from the inner wall of the accommodation cavity.

16. The test device according to claim 15, wherein the first contact is defined with a plurality of evenly spaced contacts on the inner side wall of the accommodation cavity, the second contact is defined with a plurality of evenly spaced contacts on the inner side wall of the accommodation cavity.

17. The test device according to claim 16, wherein the first contact and the second contact are respectively defined with two, the two first contacts are defined facing to each other on the inner side wall of the accommodation cavity, the two second contacts are defined facing to each other on the inner side wall of the accommodation cavity.

18. The test device according to claim 16, wherein the first contact and the second contact are respectively defined with four, the four first contacts are defined as being evenly spaced on the inner side wall of the accommodation cavity, the four second contacts are defined as being evenly spaced on the inner side wall of the accommodation cavity.

* * * * *